(12) United States Patent
Cao et al.

(10) Patent No.: US 10,929,638 B2
(45) Date of Patent: Feb. 23, 2021

(54) DISPLAY PANEL, METHOD FOR DRIVING THE SAME, AND DISPLAY DEVICE

(71) Applicant: BOE Technology Group Co., Ltd., Beijing (CN)

(72) Inventors: Xueyou Cao, Beijing (CN); Haisheng Wang, Beijing (CN); Xiaoliang Ding, Beijing (CN); Lei Wang, Beijing (CN); Wei Liu, Beijing (CN); Yanling Han, Beijing (CN); Bo Chen, Beijing (CN); Pengpeng Wang, Beijing (CN); Ping Zhang, Beijing (CN); Chihjen Cheng, Beijing (CN); Likai Deng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/383,846

(22) Filed: Apr. 15, 2019

(65) Prior Publication Data

US 2020/0042764 A1 Feb. 6, 2020

(30) Foreign Application Priority Data

Jul. 31, 2018 (CN) .......................... 201810858504.5

(51) Int. Cl.
*G06K 9/00* (2006.01)
*G06F 3/041* (2006.01)
(Continued)

(52) U.S. Cl.
CPC ........... *G06K 9/0004* (2013.01); *G06F 3/042* (2013.01); *G06F 3/0412* (2013.01); *G06F 3/0416* (2013.01); *G09G 3/3291* (2013.01); *H01L 27/3227* (2013.01); *H01L 27/3276* (2013.01); *G09G 2300/0426* (2013.01)

(58) Field of Classification Search
CPC .. G06K 9/0004; G06K 9/00013; G06F 3/042; H01L 27/3234; H01L 27/3227
See application file for complete search history.

(56) References Cited

U.S. PATENT DOCUMENTS

| 5,635,723 | A | * | 6/1997 | Fujieda | ................ G06K 9/0004 |
| | | | | | 250/556 |
| 2008/0297487 | A1 | * | 12/2008 | Hotelling | .............. G06F 3/0416 |
| | | | | | 345/173 |

(Continued)

*Primary Examiner* — Yuzhen Shen
(74) *Attorney, Agent, or Firm* — Arent Fox LLP; Michael Fainberg

(57) ABSTRACT

The disclosure discloses a display panel, a method for driving the same, and a display device, where the display panel includes a plurality of detection circuits arranged in an array, each detection circuit includes a control component, and a plurality of photosensitive recognition components arranged in an array; the control component is configured to obtain electric signals provided by the plurality of photosensitive recognition components, to process and then output, in a process of recognizing a fingerprint, the electric signals provided by the plurality of photosensitive recognition components separately, and to superimpose, in a process of detecting a touch, the electric signals provided by the plurality of photosensitive recognition components, and to process and output an electric signal resulting from the superimposition.

6 Claims, 9 Drawing Sheets

(51) Int. Cl.
*G06F 3/042* (2006.01)
*G09G 3/3291* (2016.01)
*H01L 27/32* (2006.01)

(56) References Cited

U.S. PATENT DOCUMENTS

2017/0069260 A1* 3/2017 Cho .................... G09G 3/3233
2018/0074627 A1* 3/2018 Kong .................. G06F 3/0416

* cited by examiner

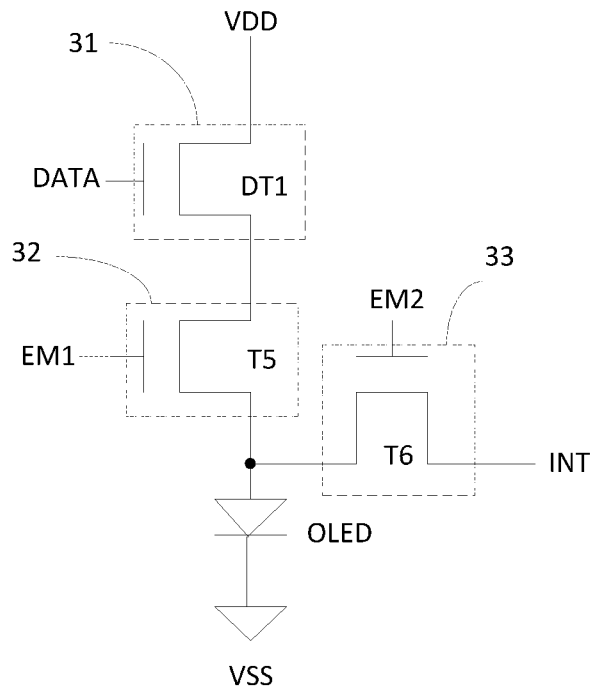

The plurality of photosensitive recognition components receive optical signals when a touch occurs or a fingerprint is to be recognized, convert the optical signals into electric signals, and provides the electric signals to a corresponding control component

S902

The control component obtains the electric signals provided by the plurality of photosensitive recognition components in a corresponding detection circuit; and in a process of recognizing the fingerprint, processes and then outputs the electric signals provided by the plurality of photosensitive recognition components in the detection circuit separately; and in a process of detecting the touch, superimposes the electric signals provided by the plurality of photosensitive recognition components in the detection circuit, and processes and outputs an electric signal resulting from the superimposition

Fig. 9

DISPLAY PANEL, METHOD FOR DRIVING THE SAME, AND DISPLAY DEVICE

CROSS-REFERENCE TO RELATED APPLICATION

This application claims priority to Chinese Patent Application No. 201810858504.5, filed on Jul. 31, 2018, the content of which is incorporated by reference in the entirety.

FIELD

This disclosure relates to the field of display technologies, and in some embodiments to a display panel, a method for driving the same, and a display device.

DESCRIPTION OF THE RELATED ART

As the display technologies are advancing gradually, there is a demand for a display device with more functions, so more attention has been paid to a display device integrated with touch and fingerprint recognition functions.

In the related art, both a touch position is detected and a fingerprint is recognized in a display panel by detecting a change of a capacitive waveform, that is, drive electrodes and sense electrodes insulated from each other are arranged, and a change of an electric signal on a sense electrode is detected to thereby detect a touch position or recognize a fingerprint. However, the internal structure of the display panel may be complicated, and the resolution of recognition may be degraded, in this detection or recognition mode.

Accordingly, it is highly desirable for those skilled in the art to simplify the structure for detecting a touch and recognizing a fingerprint.

SUMMARY

Embodiments of the disclosure provide a display panel, a method for driving the same, and a display device.

In an aspect, the embodiments of the disclosure provide a display panel including a plurality of detection circuits arranged in an array and configured to detect a touch and recognize a fingerprint; where each of the plurality of detection circuits includes a control component, and a plurality of photosensitive recognition components arranged in an array; the plurality of photosensitive recognition components are configured to: receive optical signals when a touch occurs or a fingerprint is to be recognized, convert the optical signals into electric signals, and provide the electric signals to the control component; and the control component is configured to: obtain the electric signals provided by the plurality of photosensitive recognition components, process and then output, in a process of recognizing the fingerprint, the electric signals provided by the plurality of photosensitive recognition components separately, and superimpose, in a process of detecting the touch, the electric signals provided by the plurality of photosensitive recognition components, and process and output an electric signal resulting from the superimposition.

In some embodiments, in the display panel above according to the embodiments of the disclosure, the control component includes: a plurality of first output control sub-components arranged in an array, a plurality of second output control sub-components, a plurality of third output control sub-components, a fourth output control sub-component, and a processing sub-component, where: the plurality of first output control sub-components correspond to the plurality of photosensitive recognition components in a one-to-one manner, and each of the plurality of first output control sub-components is configured to connect a corresponding photosensitive recognition component with a corresponding first node or a second node under control of a corresponding first gate line, or to disconnect the corresponding photosensitive recognition component from the corresponding first node or the second node under the control of the corresponding first gate line; the second output control sub-components are configured to connect or disconnect first nodes with or from the second node under control of a second gate line; the third output control sub-components are configured to connect or disconnect the first nodes with or from the processing sub-component under control of a third gate line; the fourth output control sub-component is configured to connect or disconnect the second node with or from the processing sub-component under control of a fourth gate line; and the processing sub-component is configured to process and output a received signal to detect a touch position or to recognize a fingerprint.

In some embodiments, in the display panel above according to the embodiments of the disclosure, respective first output control sub-components in a same column are connected with one same first node or the second node.

In some embodiments, in the display panel above according to the embodiments of the disclosure, each of the plurality of first output control sub-components includes a first transistor; where a gate of the first transistor is connected with the corresponding first gate line, a first electrode of the first transistor is connected with the corresponding photosensitive recognition component, and a second electrode of the first transistor is connected with the corresponding first node or the second node.

In some embodiments, in the display panel above according to the embodiments of the disclosure, each of the plurality of second output control sub-components includes a second transistor; where a gate of the second transistor is connected with the second gate line, a first electrode of the second transistor is connected with one corresponding first node, and a second electrode of the second transistor is connected with another corresponding first node or the second node.

In some embodiments, in the display panel above according to the embodiments of the disclosure, each of the plurality of third output control sub-components includes a third transistor; where a gate of the third transistor is connected with the third gate line, a first electrode of the third transistor is connected with a corresponding first node, and a second electrode of the third transistor is connected with the processing sub-component.

In some embodiments, in the display panel above according to the embodiments of the disclosure, the fourth output control sub-component includes a fourth transistor; where a gate of the fourth transistor is connected with the fourth gate line, a first electrode of the fourth transistor is connected with the second node, and a second electrode of the fourth transistor is connected with the processing sub-component.

In some embodiments, in the display panel above according to the embodiments of the disclosure, each of the plurality of photosensitive recognition components includes a photosensitive diode.

In some embodiments, in the display panel above according to the embodiments of the disclosure, the processing sub-component includes a plurality of integrating amplifiers, the number of which is same as a total number of the plurality of third output control sub-components and the fourth output control sub-component; where each of the plurality of integrating amplifiers has an input terminal connected with a corresponding third output control sub-component or the fourth output control sub-component, and is configured to process and output an electric signal provided by the corresponding third output control sub-component or the fourth output control sub-component.

In some embodiments, in the display panel above according to the embodiments of the disclosure, the display panel further includes a display circuit including a plurality of light-emitting components arranged in an array.

In some embodiments, in the display panel above according to the embodiments of the disclosure, an image is displayed using light emitted by the plurality of light-emitting components in a display stage; and a touch is detected, or a fingerprint is recognized, using the light emitted by the plurality of light-emitting components in a non-display stage.

In some embodiments, in the display panel above according to the embodiments of the disclosure, each of the plurality of light-emitting components includes: a drive control sub-component, a light-emitting control sub-component, an anode level control sub-component, and a light-emitting device, where: the drive control sub-component is configured to provide the light-emitting control sub-component with drive voltage for driving the light-emitting device to emit light, under control of a data signal terminal; the light-emitting control sub-component is configured to provide the drive voltage to an anode of the light-emitting device to drive the light-emitting device to display, under control of a first control terminal; and the anode level control sub-component is configured to provide a modulated signal transmitted from a first signal terminal to the anode of the light-emitting device under control of a second control terminal to enable the light-emitting device to emit modulated light for detecting a touch; or to generate a modulated signal from a direct-current signal transmitted from a first signal terminal, and to provide the modulated signal to the anode of the light-emitting device, under control of a second control terminal to enable the light-emitting device to emit modulated light for detecting a touch.

In some embodiments, in the display panel above according to the embodiments of the disclosure, the drive control sub-component includes a drive transistor; where a gate of the drive transistor is connected with the data signal terminal, a first electrode of the drive transistor is connected with a drive signal terminal, and a second electrode of the drive transistor is connected with the light-emitting control sub-component.

In some embodiments, in the display panel above according to the embodiments of the disclosure, the light-emitting control sub-component includes a fifth transistor; where a gate of the fifth transistor is connected with the first control terminal, a first electrode of the fifth transistor is connected with the drive control sub-component, and a second electrode of the fifth transistor is connected with the anode of the light-emitting device.

In some embodiments, in the display panel above according to the embodiments of the disclosure, the anode level control sub-component includes a sixth transistor, where a gate of the sixth transistor is connected with the second control terminal, a first electrode of the sixth transistor is connected with the first signal terminal, and a second electrode of the sixth transistor is connected with the anode of the light-emitting device.

In some embodiments, in the display panel above according to the embodiments of the disclosure, in a period of time of one frame, light emitted from light-emitting components in a first area is used for recognizing a fingerprint, and light emitted from light-emitting components in another area than the first area is used for displaying an image and detecting a touch; where the first area is an area predetermined according to an area in which a touch occurred in a previous frame.

In another aspect, the embodiments of the disclosure further provide a method for driving the display panel above according to the embodiments of the disclosure, the method including: receiving, by the plurality of photosensitive recognition components, the optical signals when a touch occurs or a fingerprint is to be recognized, converting the optical signals into the electric signals, and providing the electric signals to the control component; and obtaining, by the control component, the electric signals provided by the plurality of photosensitive recognition components, processing and then outputting, in a process of recognizing the fingerprint, the electric signals provided by the plurality of photosensitive recognition components separately, and superimposing, in a process of detecting the touch, the electric signals provided by the plurality of photosensitive recognition components, and processing and outputting the electric signal resulting from the superimposition.

In some embodiments, in the method for driving the display panel above according to the embodiments of the disclosure, obtaining, by the control component, the electric signals provided by the plurality of photosensitive recognition components, and processing and then outputting, in the process of recognizing the fingerprint, the electric signals provided by the plurality of photosensitive recognition components separately, and superimposing, in the process of detecting the touch, the electric signals provided by the plurality of photosensitive recognition components, and processing and outputting the electric signal resulting from the superimposition includes: in a fingerprint recognition stage, controlling, by first gate lines, first output control sub-components to be turned on to provide the electric signals provided by the plurality of photosensitive recognition components to first nodes or a second node, controlling, by a second gate line, second output control sub-components to be turned off, controlling, by a third gate line, third output control sub-components to be turned on to provide electric signals at the first nodes to a processing sub-component, and controlling, by a fourth gate line, a fourth output control sub-component to be turned on to provide a level of the second node to the processing sub-component; and in a touch detection stage, controlling, by the first gate lines, the first output control sub-components to be turned on to provide the electric signals provided by the plurality of photosensitive recognition components to the corresponding first nodes or the second node, controlling, by the second gate line, the second output control sub-components to be turned on to provide the electric signals at the first nodes to the second node, controlling, by the third gate line, the third output control sub-components to be turned off, and controlling, by the fourth gate line, the fourth output control sub-component to be turned on to provide the level of the second node to the processing sub-component.

In some embodiments, in the method for driving the display panel above according to the embodiments of the disclosure, when transistors in the first output control sub-components, the second output control sub-components, the third output control sub-components, and the fourth output control sub-component are of a same type, a first voltage signal is input on the first gate lines per row, a second voltage signal is input on the second gate line, and the first voltage signal is input on the third gate line and the fourth gate line concurrently, in the fingerprint recognition stage; and the first voltage signal is input on the first gate lines, the first voltage signal is input on the second gate line and the third gate line concurrently, and the second voltage signal is input on the third gate line, in the touch detection stage.

In still another aspect, the embodiments of the disclosure further provide a display device, including the display panel above according to the embodiments of the disclosure.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

FIG. 8 is a schematic structural diagram in details of a light-emitting component in the display panel according to the embodiments of the disclosure.

FIG. 9 is a flow chart of a method for driving a display panel according to the embodiments of the disclosure.

DETAILED DESCRIPTION OF THE EMBODIMENTS

Figure 1:
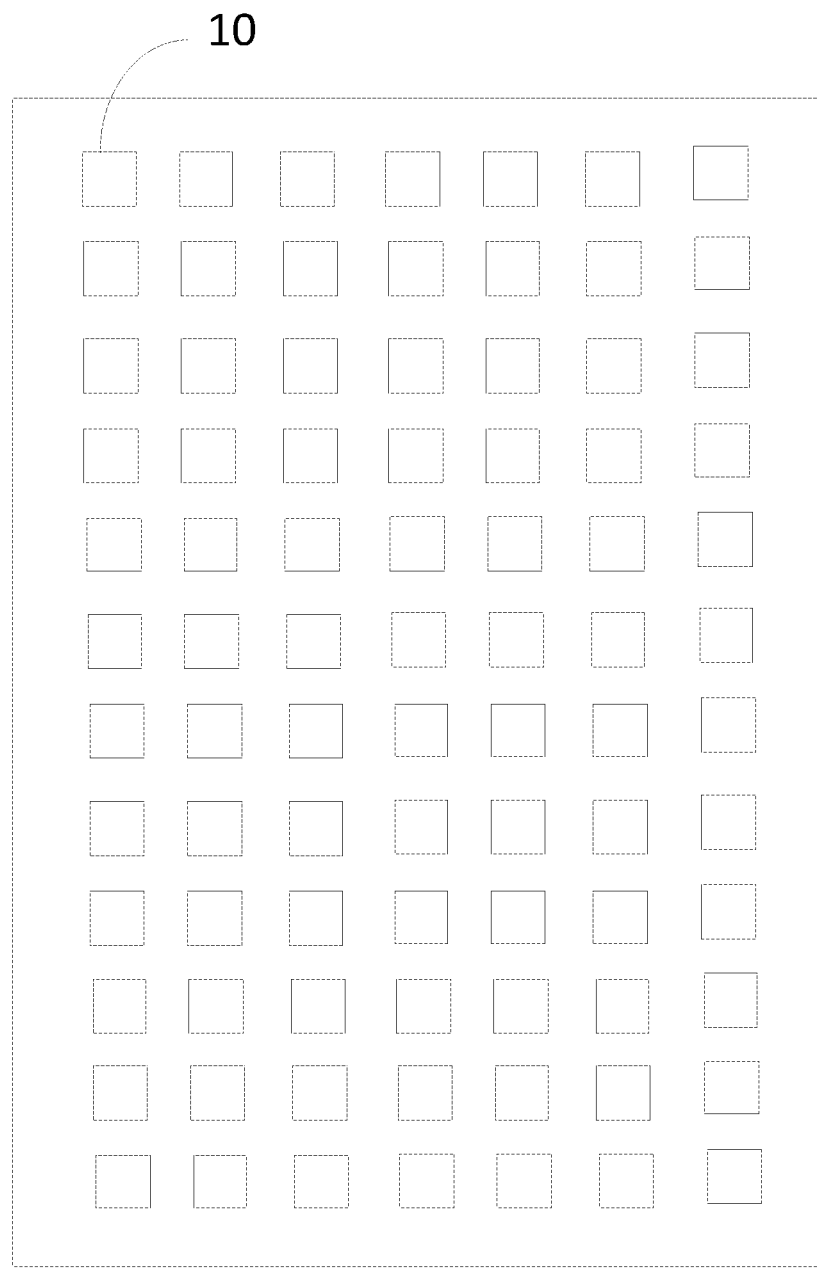
FIG. 1 is a first schematic structural diagram of detection circuits distributed in a display panel according to the embodiments of the disclosure.

In view of the problem in the related art of the complex structure for detecting a touch and recognizing a fingerprint, the embodiments of the disclosure provide a display panel, a method for driving the same, and a display device. In order to make the objects, technical solutions, and advantages of the disclosure more apparent, particular implementations of the display panel, the method for driving the same, and the display device according to the embodiments of the disclosure will be described below in details with reference to the drawings. It shall be appreciated that the preferable embodiments to be described are only intended to illustrate and explain the disclosure, but not intended to limit the disclosure thereto. Furthermore, the embodiments of the disclosure and the features in the embodiments of the disclosure can be combined with each other unless they conflict with each other.

The shapes and sizes of respective components in the drawings are not intended to reflect any real proportion, but only intended to illustrate the disclosure of the disclosure.

Figure 2:
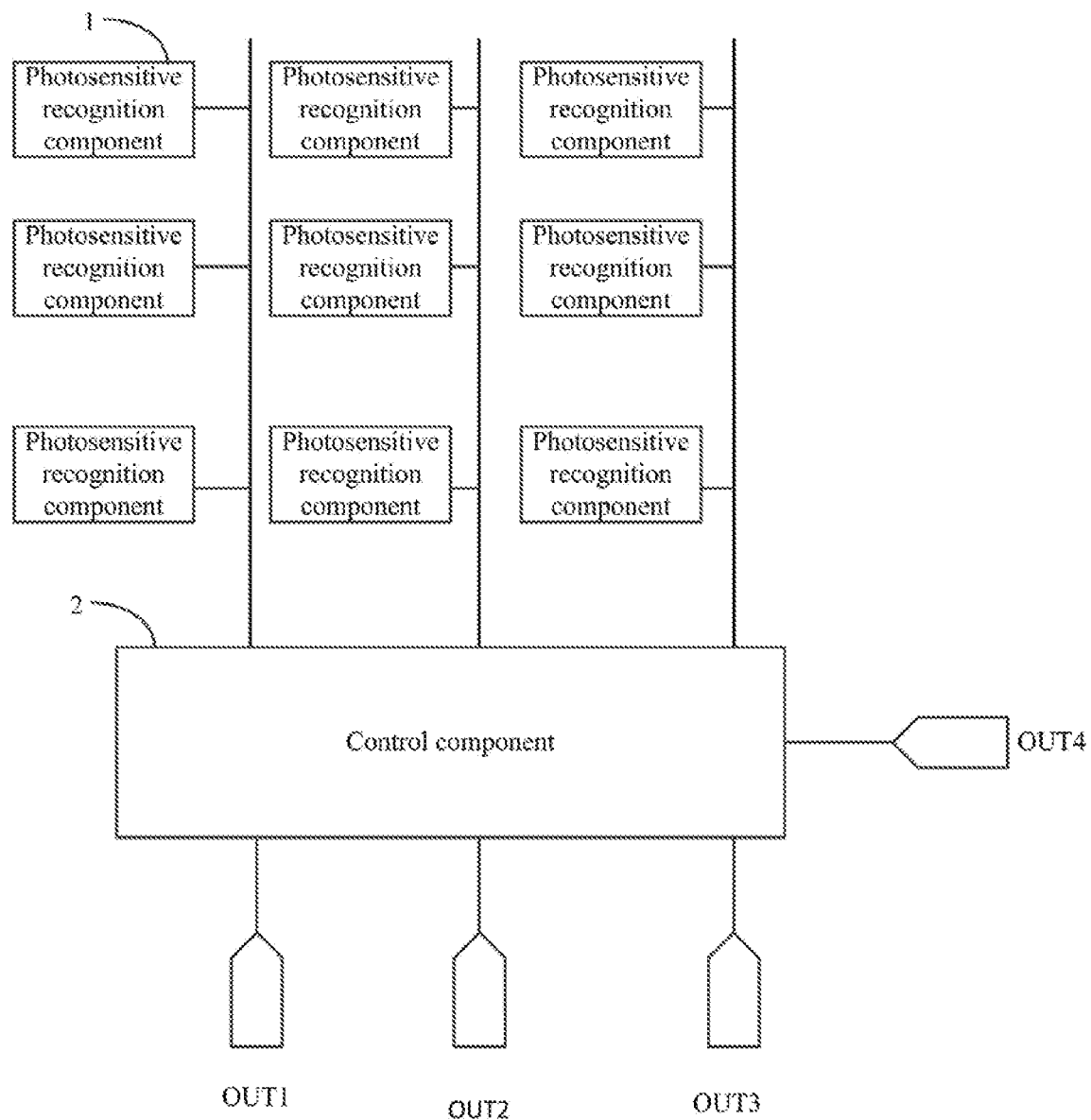
FIG. 2 is a second schematic structural diagram of a detection circuit distributed in the display panel according to the embodiments of the disclosure.

As illustrated in FIG. 1 and FIG. 2, a display panel according to the embodiments of the disclosure includes a plurality of detection circuits 10 arranged in an array and configured to detect a touch and recognize a fingerprint; where each detection circuit 10 includes a control component 2, and a plurality of photosensitive recognition components 1 arranged in an array, where: the plurality of photosensitive recognition components 1 are configured to receive optical signals when a touch occurs or a fingerprint is to be recognized, to convert the optical signals into electric signals, and to provide the electric signals to the control component 2; and the control component 2 is configured to obtain the electric signals provided by the plurality of photosensitive recognition components 1 in the detection circuit 10, and in a process of recognizing the fingerprint, to process and then output the electric signals provided by the plurality of photosensitive recognition components in the detection circuit 10 separately, and in a process of detecting the touch, to superimpose the electric signals provided by the plurality of photosensitive recognition components 1 in the detection circuit 10, and to process and output an electric signal resulting from the superimposition.

The display panel above according to the embodiments of the disclosure includes a plurality of detection circuits, arranged in an array and configured to detect a touch and recognize a fingerprint, where each detection circuit includes a control component, and a plurality of photosensitive recognition components arranged in an array, where the plurality of photosensitive recognition components are configured to receive optical signals when a touch occurs or a fingerprint is to be recognized, to convert the optical signals into electric signals, and to provide the electric signals to the control component; and the control component is configured to obtain the electric signals provided by the plurality of photosensitive recognition components in the detection circuit, and for recognizing the fingerprint, to process and then output the electric signals provided by the plurality of photosensitive recognition components in the detection circuit separately, and for detecting the touch, to superimpose the electric signals provided by the plurality of photosensitive recognition components in the detection circuit, and to process and output an electric signal resulting from the superimposition. The photosensitive recognition components and the control component cooperate with each other so that a touch position can be detected and a fingerprint can be recognized using a same detection circuit to thereby simplify a structure for detecting a touch position and recognizing a fingerprint in the display panel; and a touch position can be detected and a fingerprint can be recognized optically to thereby improve the precision of detecting a touch and recognizing a fingerprint.

In some embodiments, in the display panel above according to the embodiments of the disclosure, as illustrated in FIG. 2, for recognizing the fingerprint, the control component 2 obtains the electric signals provided by the photosensitive recognition components 1 in the detection circuit one by one, processes the electric signals provided by the photosensitive recognition components 1 individually, and then outputs them respectively at a first output terminal OUT1, a second output terminal OUT2, or a third output terminal OUT3; and for detecting the touch, the control component obtains the electric signals provided by the photosensitive recognition components in the detection circuit, processes the electric signals provided by the photosensitive recognition components together, and outputs a signal as a result of the processing, at a fourth output terminal OUT4.

Figure 3:
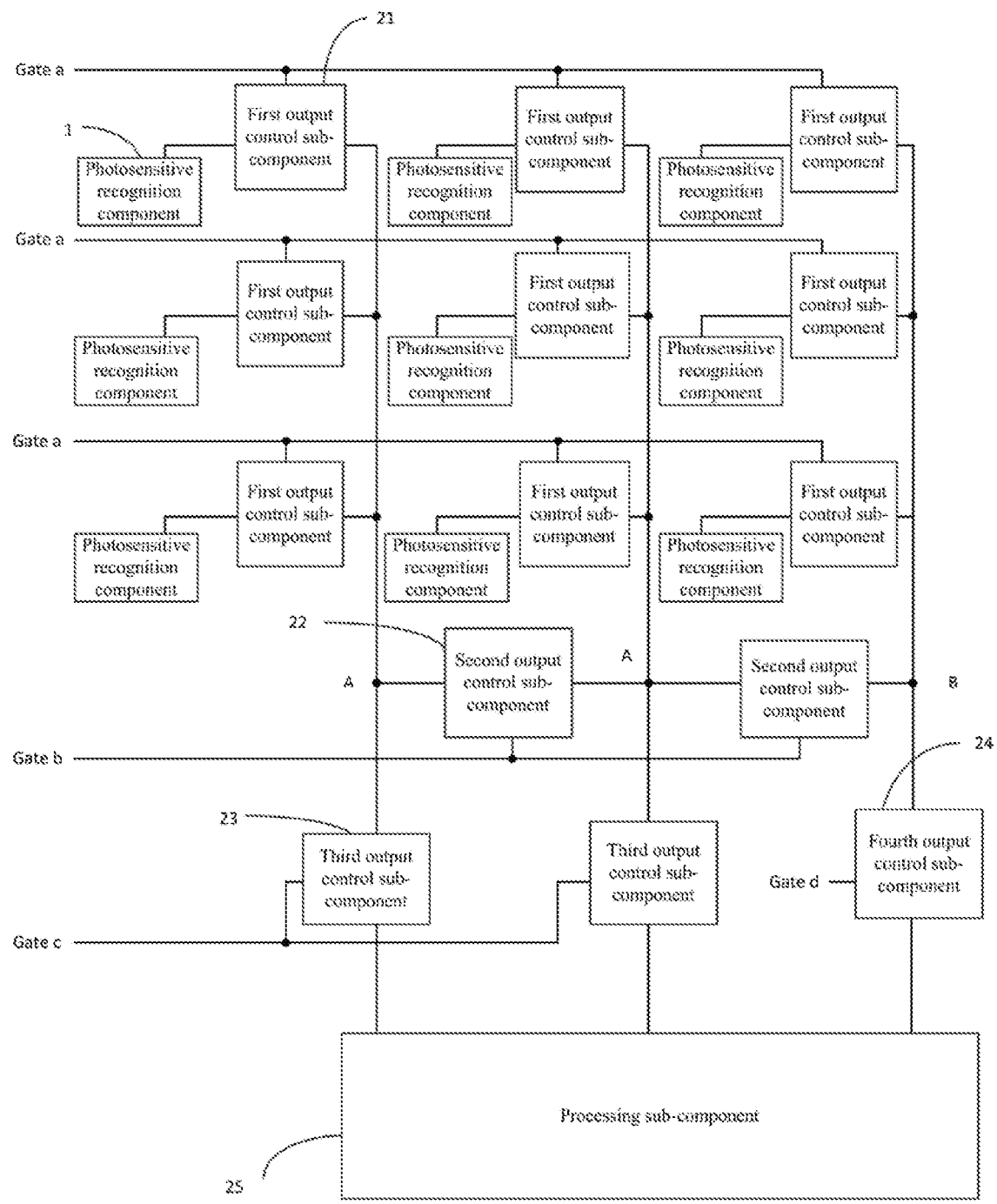
FIG. 3 is a schematic structural diagram of a detection circuit in the display panel according to the embodiments of the disclosure.

In some embodiments, in the display panel above according to the embodiments of the disclosure, as illustrated in FIG. 3, each control component includes: a plurality of first output control sub-components 21 arranged in an array, a plurality of second output control sub-components 22, a plurality of third output control sub-components 23, a fourth output control sub-component 24, and a processing sub-component 25.

Where the plurality of first output control sub-components 21 correspond to the plurality of photosensitive recognition components 1 in the detection circuit 10 in a one-to-one manner, and each photosensitive recognition component is configured to connect a corresponding photosensitive recognition component 1 with a first node A or a second node B under the control of a first gate line Gate a, or to disconnect the corresponding photosensitive recognition component from the corresponding first node A or the second node B under the control of the first gate line Gate a; the second output control sub-components 22 are configured to connect or disconnect first nodes A with or from the second node B under the control of a second gate line Gate b; the third output control sub-components 23 are configured to connect or disconnect the first nodes A with or from the processing sub-component 25 under the control of a third gate line Gate c; the fourth output control sub-component 24 is configured to connect or disconnect the second node B with or from the processing sub-component 25 under the control of a fourth gate line Gate d; and the processing sub-component 25 is configured to process and output the received signal to detect a touch position or to recognize the fingerprint.

In some embodiments, in the display panel above according to the embodiments of the disclosure, as illustrated in FIG. 3, respective first output control sub-components 21 in a same column are connected with one same first node A or the second node B.

In some embodiments, in the display panel above according to the embodiments of the disclosure, a touch position is detected and a fingerprint is recognized by sensing the brightness of light using a detection circuit so that not only a touch position can be detected but also a fingerprint can be recognized using a same detection circuit. In some embodiments, respective detection circuits detect a touch position and recognize a fingerprint by acquiring signals in respective zones, and a circuit structure of each detection circuit is designed according to required resolutions of detecting a touch position and recognizing a fingerprint. Where the required resolution of recognizing a fingerprint is far higher than the required resolution of detecting a touch position in that the resolution of recognizing a fingerprint is generally 400 PPI, which is a resolution at a pixel level; and the resolution of detecting a touch optically is lower, which is generally at a physical level, for example, generally 4 mm or so. Since a touch is detected and a fingerprint is recognized using the same photosensitive recognition components, photosensitive elements in the photosensitive recognition components will be driven differently to detect a touch than to recognize a fingerprint, and their driving processes will be described in details in the following embodiments, although a detailed description thereof will be skipped.

Figure 4:
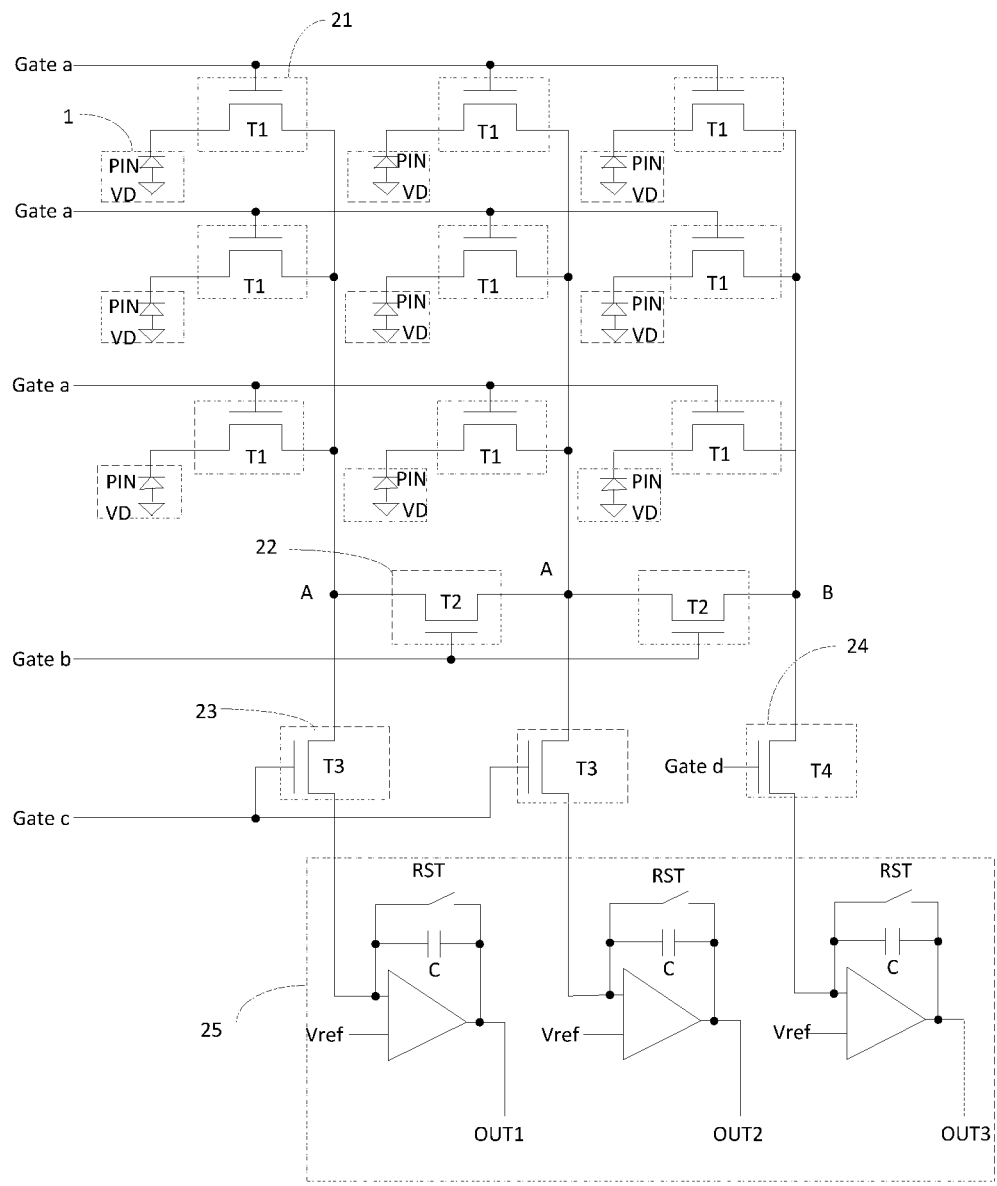
FIG. 4 is a schematic structural diagram in details of a detection circuit in the display panel according to the embodiments of the disclosure.

In some embodiments, in the display panel above according to the embodiments of the disclosure, as illustrated in FIG. 4, each first output control sub-component 21 includes a first transistor T1, where: a gate of the first transistor T1 is connected with a corresponding first gate line Gate a, a first electrode of the first transistor T1 is connected with a corresponding photosensitive recognition component 1, and a second electrode of the first transistor T1 is connected with a corresponding first node A or the second node B.

In some embodiments, in the display panel above according to the embodiments of the disclosure, when a high-level signal is input on the first gate line, the first transistor is turned on, and the photosensitive recognition component converts the currently recognized optical signal into an electric signal, and provides the electric signal to a first node or the second node through the first transistor which is turned on.

A particular structure of the first output control sub-component in the detection circuit has been described above only by way of an example, and in a particular implementation, the particular structure of the first output control sub-component will not be limited to the structure above according to the embodiments of the disclosure, but can alternatively be another structure which can occur to those skilled in the art, and the embodiments of the disclosure will not be limited thereto.

In some embodiments, in the display panel above according to the embodiments of the disclosure, as illustrated in FIG. 4, each second output control sub-component 22 includes a second transistor T2, where: a gate of the second transistor T2 is connected with the second gate line Gate b, a first electrode of the second transistor T2 is connected with one first node A, and a second electrode of the second transistor T2 is connected with another first node A or the second node B.

In some embodiments, in the display panel above according to the embodiments of the disclosure, when a high-level signal is input on the second gate line, the second transistor is turned on to provide a level of the first node to the next first node or the second node, that is, the levels of all the first nodes and the second node are superimposed over each other, and provided to the fourth output control sub-component.

A particular structure of the second output control sub-component in the detection circuit has been described above only by way of an example, and in a particular implementation, the particular structure of the second output control sub-component will not be limited to the structure above according to the embodiments of the disclosure, but can alternatively be another structure which can occur to those skilled in the art, and the embodiments of the disclosure will not be limited thereto.

In some embodiments, in the display panel above according to the embodiments of the disclosure, as illustrated in FIG. 4, each third output control sub-component 23 includes a third transistor T3, where: a gate of the third transistor T3 is connected with the third gate line Gate c, a first electrode of the third transistor T3 is connected with a corresponding first node A, and a second electrode of the third transistor T3 is connected with the processing sub-component 25.

In some embodiments, in the display panel above according to the embodiments of the disclosure, when a high-level signal is input on the third gate line, the third transistor is turned on to provide the level of the first node to the processing sub-component.

A particular structure of the third output control sub-component in the detection circuit has been described above only by way of an example, and in a particular implementation, the particular structure of the third output control sub-component will not be limited to the structure above according to the embodiments of the disclosure, but can alternatively be another structure which can occur to those skilled in the art, and the embodiments of the disclosure will not be limited thereto.

In some embodiments in the display panel above according to the embodiments of the disclosure, as illustrated in FIG. 4, the fourth output control sub-component 24 includes a fourth transistor T4, where: a gate of the fourth transistor T4 is connected with the fourth gate line Gate d, a first electrode of the fourth transistor T4 is connected with the second node B, and a second electrode of the fourth transistor T4 is connected with the processing sub-component 25.

In some embodiments, in the display panel above according to the embodiments of the disclosure, when a high-level signal is input on the fourth gate line, the fourth transistor is turned on to provide the level of the second node to the processing sub-component.

A particular structure of the fourth output control sub-component in the detection circuit has been described above only by way of an example, and in a particular implementation, the particular structure of the fourth output control sub-component will not be limited to the structure above according to the embodiments of the disclosure, but can alternatively be another structure which can occur to those skilled in the art, and the embodiments of the disclosure will not be limited thereto.

In some embodiments, in the display panel above according to the embodiments of the disclosure, as illustrated in FIG. 4, each photosensitive recognition component 1 includes a photosensitive diode PIN configured to recognize a current brightness of light, and to convert an optical signal into an electric signal, where the photosensitive diode is reverse-biased, that is, negative voltage is applied to a VD signal terminal thereof.

In some embodiments, in the display panel above according to the embodiments of the disclosure, as illustrated in FIG. 4, the processing sub-component 25 includes a plurality of integrating amplifiers, the number of which is the same as the total number of the third output control sub-components and the fourth output control sub-component in the control component; where an input terminal of each integrating amplifier is connected with a corresponding third output control sub-component 23 or the fourth output control sub-component 24, and each integrating amplifier is configured to process and output an electric signal provided by the corresponding third output control sub-component 23 or the fourth output control sub-component 24, that is, the signal processed by the integrating amplifier is output at the output terminal (OUT1, OUT2, or OUT3).

In some embodiments, in the display panel above according to the embodiments of the disclosure, the signal of each photosensitive diode is acquired by being time-integrated by the integrating amplifier to thereby recognize a minute change of the signal.

It shall be noted that, respective operating processes of a switch RST, a capacitor C, and a signal terminal Vref in each integrating amplifier will be the same as those in the related art, so a repeated description thereof will be omitted here. Of course, each processing sub-component will include an analog to digital converting circuit, a CPU processor, etc., in addition to the integrating amplifiers, and particular functions thereof will also be the same as those in the related art, so a repeated description thereof will be omitted here.

Figure 5:
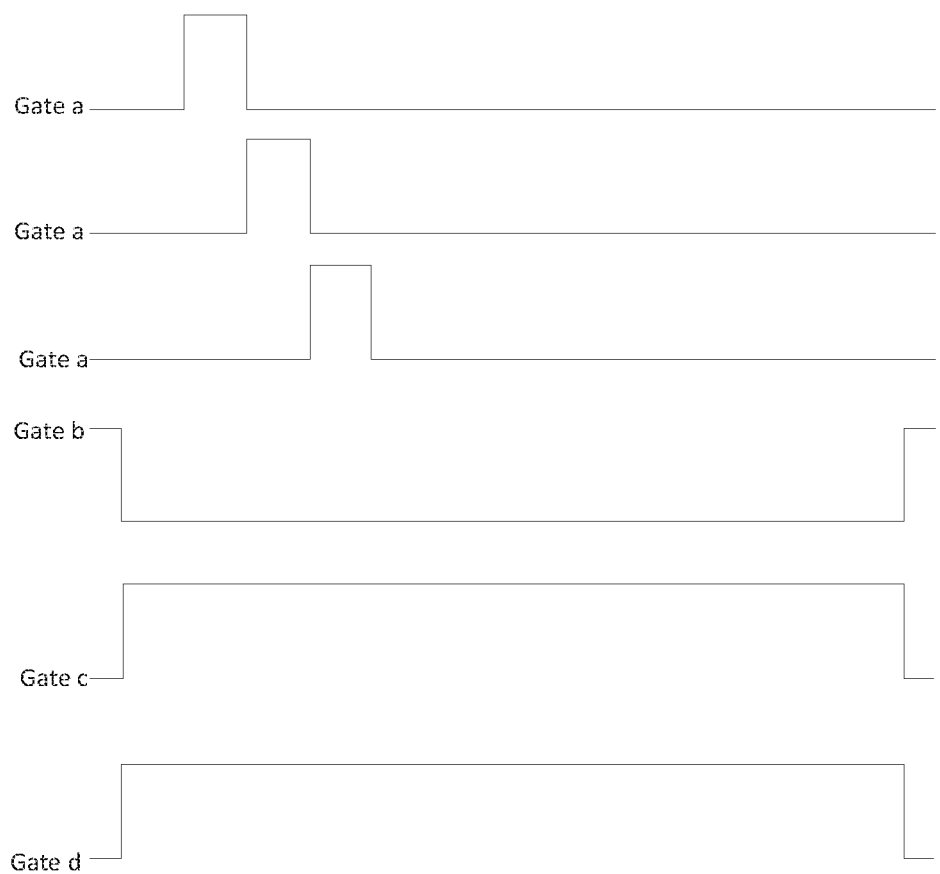
FIG. 5 is a timing diagram of driving a detection circuit to recognize a fingerprint in the display panel according to the embodiments of the disclosure.
Figure 6:
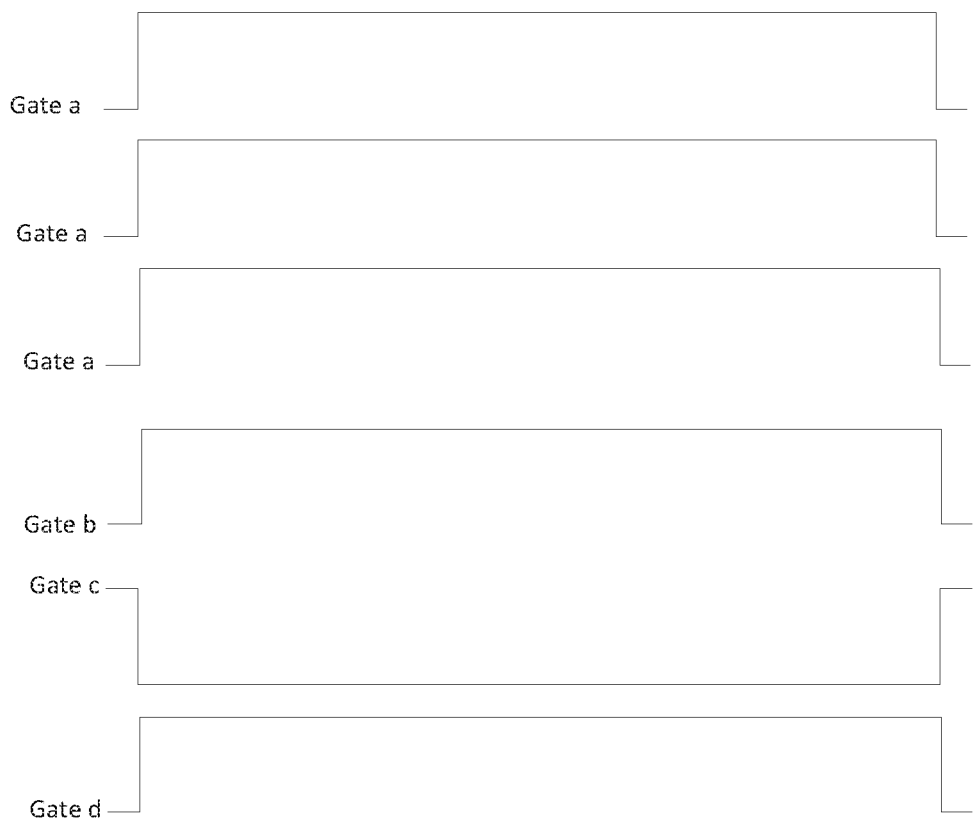
FIG. 6 is a timing diagram of driving a detection circuit to detect a touch in the display panel according to the embodiments of the disclosure.

An operating principle of the detection circuit above will be described below taking the circuit structure as illustrated in FIG. 4 as an example with reference to the timing diagrams as illustrated in FIG. 5 and FIG. 6.

A fingerprint recognition stage will be described below taking the circuit structure as illustrated in FIG. 4 with reference to the timing diagram as illustrated in FIG. 5.

A high-level signal is input to all the first gate lines Gate a per row, and the first transistors T1 are turned on per row to provide the current signals detected by the corresponding photosensitive diodes PIN to the first nodes A or the second node B; a high-level signal is input to both the third gate line Gate c and the fourth gate line Gate d so that the third transistors T3 and the fourth transistor T4 are turned on, and the level of each first node A or the second node B is provided to the corresponding integrating amplifier through the third transistors T3 and the fourth transistor T4 which are turned on; and a low-level signal is provided to the second gate line Gate b so that all the second transistors T2 are turned off. Stated otherwise, in the fingerprint recognition stage, the current optical signal recognized by each photosensitive diode PIN is acquired individually, and time-integrated by the corresponding integrating amplifier to acquire a change of photo charges in each photosensitive diode PIN.

A touch detection stage will be described below taking the circuit structure as illustrated in FIG. 4 with reference to the timing diagram as illustrated in FIG. 6.

A high-level signal is provided concurrently to all the first gate lines Gate a so that all the first transistors T1 are turned on concurrently, and the electric signals into which the current brightness signals at the corresponding positions acquired by all the photosensitive diodes PIN are converted are provided to the first nodes A or the second node B; a high-level signal is provided to the second gate line Gate b so that all the second transistors T2 are turned on, and the sum of the levels of all the first nodes A and the second node B is provided to the first electrode of the fourth transistor T4; a low-level signal is provided to the third gate line Gate c so that all the third transistors T3 are turned off; and a high-level signal is provided to the fourth gate line Gate d so that the fourth transistor T4 is turned on, the sum of the levels of all the first nodes A and the second node B is provided to the integrating amplifier corresponding to the fourth transistor T4, and the optical signals recognized by all the photosensitive diodes PIN in the detection circuit are time-integrated, that is, a change of a value of photo current in a zone including the detection circuit is acquired as a whole in this stage.

It shall be noted that, in the display panel above according to the embodiments of the disclosure, a fingerprint is optically recognized in an integration mode in which the photo charges produced by each photosensitive diode after being illuminated is integrated into the subsequent integrating amplifier to thereby read information about valleys and ridges in the fingerprint; and a touch is optically detected in a current-integration mode in which the photo current produced by all the photosensitive diodes in the detection circuit is integrated into the subsequent integrating amplifier to thereby read a touch signal.

In some embodiments, in the display panel above according to the embodiments of the disclosure, the display panel further includes a display circuit including a plurality of light-emitting components arranged in an array.

In some embodiments, in the display panel above according to the embodiments of the disclosure, an image is displayed using light emitted by the light-emitting components in a display stage; and a touch is detected, or a fingerprint is recognized, using the light emitted by the light-emitting components in a non-display stage.

In some embodiments, in the display panel above according to the embodiments of the disclosure, an image is displayed using the light-emitting components, but also a touch is detected, and a fingerprint is recognized, using the light-emitting components. A period of time of one frame includes a display stage and a blank stage, where the light-emitting components are configured to emit light for displaying an image, according to signals input to pixels on data lines in the display stage, and to emit light for recognizing a touch and recognizing a fingerprint, in the blank stage, where firstly the light for recognizing a touch, and then the light for recognizing a fingerprint, or firstly the light for recognizing a fingerprint, and then the light for recognizing a touch can be emitted as needed in reality, although the embodiments of the disclosure will not be limited thereto.

Figure 7:
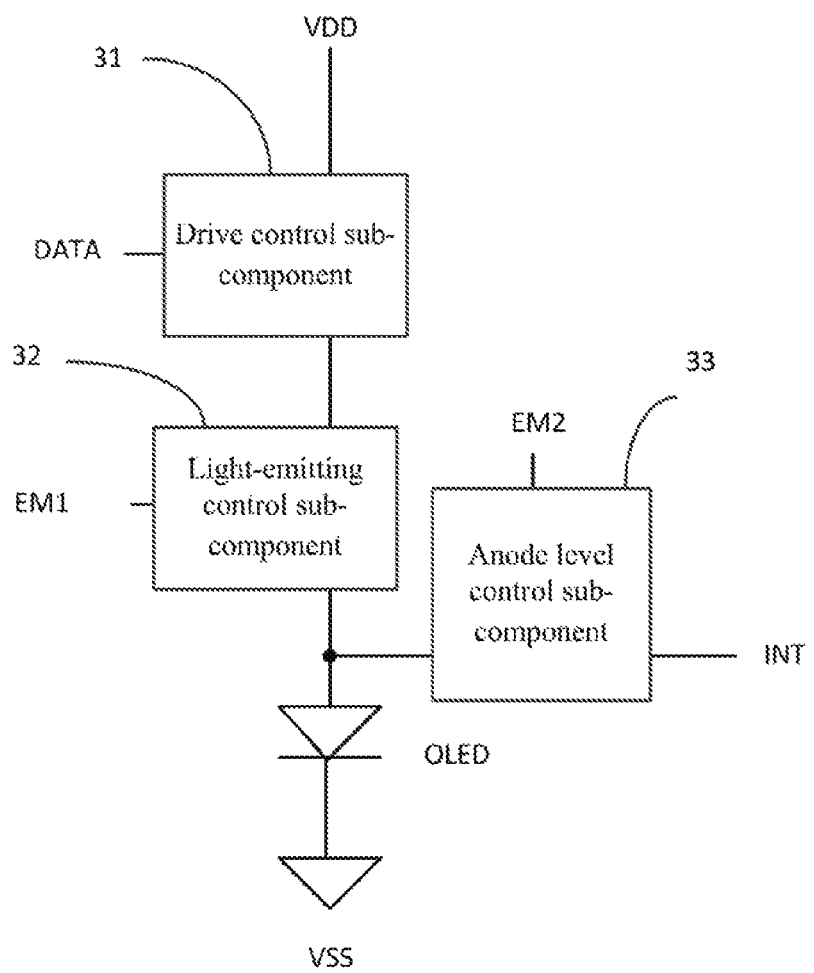
FIG. 7 is a schematic structural diagram of a light-emitting component in the display panel according to the embodiments of the disclosure.

In some embodiments, in the display panel above according to the embodiments of the disclosure, as illustrated in FIG. 7, each light-emitting component includes: a drive control sub-component 31, a light-emitting control sub-component 32, an anode level control sub-component 33, and a light-emitting device OLED.

The drive control sub-component 31 is configured to provide the light-emitting control sub-component 32 with drive voltage for driving the light-emitting device OLED to emit light, under the control of a data signal terminal DATA.

The light-emitting control sub-component 32 is configured to provide the drive voltage to an anode of the light-emitting device OLED to drive the light-emitting device OLED to display, under the control of a first control terminal EM1.

The anode level control sub-component 33 is configured to provide a modulated signal transmitted from a first signal terminal INT to the anode of the light-emitting device OLED under the control of a second control terminal EM2, so that the light-emitting device OLED emits modulated light for detecting a touch; or to generate a modulated signal from a direct-current signal transmitted from the first signal terminal INT, and to provide the modulated signal to the anode of the light-emitting device OLED, under the control of the second control terminal EM2, so that the light-emitting device OLED emits modulated light for detecting a touch.

In some embodiments, in the display panel above according to the embodiments of the disclosure, as illustrated in FIG. 8, the drive control sub-component 31 includes a drive transistor DT1, where: a gate of the drive transistor DT1 is connected with the data signal terminal DATA, a first electrode of the drive transistor DT1 is connected with a drive signal terminal VDD, and a second electrode of the drive transistor DT1 is connected with the light-emitting control sub-component 32.

In some embodiments, in the display panel above according to the embodiments of the disclosure, when there is a data signal input to the data signal terminal, the drive transistor provides the light-emitting control sub-component with the drive voltage for driving the light-emitting device to emit light.

A particular structure of the drive control sub-component in the detection circuit has been described above only by way of an example, and in a particular implementation, the particular structure of the drive control sub-component will not be limited to the structure above according to the embodiments of the disclosure, but can alternatively be another structure which can occur to those skilled in the art, and the embodiments of the disclosure will not be limited thereto.

In some embodiments, in the display panel above according to the embodiments of the disclosure, as illustrated in FIG. 8, the light-emitting control sub-component 32 includes a fifth transistor T5, where: a gate of the fifth transistor T5 is connected with the first control terminal EM1, a first electrode of the fifth transistor T5 is connected with the drive control sub-component 31, and a second electrode of the fifth transistor T5 is connected with the anode of the light-emitting device OLED.

Here a cathode of the light-emitting device OLED is connected with a low-level signal terminal VSS, or grounded.

In some embodiments, in the display panel above according to the embodiments of the disclosure, when a high-level signal is provided to the gate of the fifth transistor, the fifth transistor is turned on to provide the drive voltage to the anode of the light-emitting device to drive the light-emitting device to emit light, and at this time, the light emitted by the light-emitting device is dependent upon the input data signal, so the light emitted using the data signal at this time is used for displaying.

A particular structure of the light-emitting control sub-component in the detection circuit has been described above only by way of an example, and in a particular implementation, the particular structure of the light-emitting control sub-component will not be limited to the structure above according to the embodiments of the disclosure, but can alternatively be another structure which can occur to those skilled in the art, and the embodiments of the disclosure will not be limited thereto.

In some embodiments, in the display panel above according to the embodiments of the disclosure, as illustrated in FIG. 8, the anode level control sub-component 33 includes a sixth transistor T6, where: a gate of the sixth transistor T6 is connected with the second control terminal EM2, a first electrode of the sixth transistor T6 is connected with the first signal terminal INT, and a second electrode of the sixth transistor T6 is connected with the anode of the light-emitting device OLED.

In some embodiments, in the display panel above according to the embodiments of the disclosure, when a high-level signal is provided to the gate of the sixth transistor, the sixth transistor is turned on to provide the modulated signal input at the first signal terminal to the anode of the light-emitting device so that the light-emitting device emits the modulated light for detecting a touch.

Alternatively, the direct-current signal (e.g., a high-level signal) is transmitted from the first signal terminal, and timing of a signal of the second control terminal is controlled to control the sixth transistor to be turned on or off, so that when the sixth transistor is turned on, the signal of the first signal terminal, i.e., the high-level signal, is provided to the anode of the light-emitting device through the sixth transistor which is turned on so that the light-emitting device emits light; and when the sixth transistor is turned off, the signal of the first signal terminal cannot be provided to the anode of the light-emitting device, so the light-emitting device does not emit any light. This process is repeated periodically so that the light-emitting device emits the modulated light. Stated otherwise, the signal transmitted from the first signal terminal is the direct-current signal, and the sixth transistor is controlled using the second control terminal to be turned on or off so that the signal provided to the anode of the light-emitting device is the modulated signal, and thus the light-emitting device emits the modulated light.

A particular structure of the anode level control sub-component in the detection circuit has been described above only by way of an example, and in a particular implementation, the particular structure of the anode level control sub-component will not be limited to the structure above according to the embodiments of the disclosure, but can alternatively be another structure which can occur to those skilled in the art, and the embodiments of the disclosure will not be limited thereto.

It shall be noted that, in the display panel above according to the embodiments of the disclosure, the fifth transistor and the sixth transistor are not turned on concurrently so that only one of the transistors is turned on, and the other transistor is turned off, at the same instance of time, so the light emitted from the light-emitting device will not be affected.

It shall be noted that, the process above has been described by way of an example in which all the transistors are N-type transistors, but the same operating principle will apply when all the transistors are P-type transistors, so a repeated description thereof will be omitted here.

In order to simplify a fabrication process, in a particular implementation, in the display panel above according to the embodiments of the disclosure, all the switch transistors can be N-type switch transistors, or all the switch transistors can be P-type switch transistors, although the embodiments of the disclosure will not be limited thereto.

In some embodiments, in the display panel above according to the embodiments of the disclosure, in a period of time of one frame, light emitted from light-emitting components in a first area is used for recognizing a fingerprint, and light emitted from light-emitting components in another area than the first area is used for displaying an image and detecting a touch, where the first area is an area predetermined according to an area in which a touch occurred in the previous frame, i.e. the last frame.

In some embodiments, in the display panel above according to the embodiments of the disclosure, in order to recognize a fingerprint, only the light emitted from light-emitting components in the first area of the display panel is used for recognizing a fingerprint to thereby lower interference of noise to recognition of the fingerprint; and in some embodiments, only the light-emitting components in the area, in which the touch occurred in the previous frame, detected by the detection circuit are enabled to emit light for recognizing a fingerprint, that is, only the light-emitting components in an area where a finger is located emit light, where the area where the finger is located can include light-emitting components in a 6*6 array, or can include light-emitting components in a 8*8 array, as needed in reality, although the embodiments of the disclosure will not be limited thereto. When the light emitted from the light-emitting components in the area where the finger is located is used for recognizing a fingerprint, no display scan will be performed in the area to thereby lower interference of noise to recognition of the fingerprint. Here a particular structure of each light-emitting component can be the same as the structure of the light-emitting component in the embodiments above, so a repeated description thereof will be omitted here.

Based upon the same inventive concept, the embodiments of the disclosure further provide a method for driving the display panel above, and as illustrated in FIG. 9, the method includes the following operations.

In the operation S901, the plurality of photosensitive recognition components receive optical signals when a touch occurs or a fingerprint is to be recognized, convert the optical signals into electric signals, and provides the electric signals to a corresponding control component.

In the operation S902, the control component obtains the electric signals provided by the plurality of photosensitive recognition components in a corresponding detection circuit; and in a process of recognizing the fingerprint, processes and then outputs the electric signals provided by the plurality of photosensitive recognition components in the detection circuit separately; and in a process of detecting the touch, superimposes the electric signals provided by the plurality of photosensitive recognition components in the detection circuit, and processes and outputs an electric signal resulting from the superimposition.

In some embodiments, in the method above for driving the display panel according to the embodiments of the disclosure, the operation S902 includes following stages.

A fingerprint recognition stage in which first gate lines control first output control sub-components to be turned on to provide the electric signals provided by the plurality of photosensitive recognition components to first nodes or a second node, a second gate line controls second output control sub-components to be turned off, a third gate line controls third output control sub-components to be turned on to provide electric signals at the first nodes to a processing sub-component, and a fourth gate line controls a fourth output control sub-component to be turned on to provide a level of the second node to the processing sub-component.

A touch detection stage in which the first gate lines control the first output control sub-components to be turned on to provide the electric signals provided by the plurality of photosensitive recognition components to the first nodes or the second node, the second gate line controls the second output control sub-components to be turned on to provide the electric signals at the first nodes to the second node, the third gate line controls the third output control sub-components to be turned off, and the fourth gate line controls the fourth output control sub-component to be turned on to provide the level of the second node to the processing sub-component.

In some embodiments, in the method above for driving the display panel according to the embodiments of the disclosure, when all the transistors in the first output control sub-components, the second output control sub-components, the third output control sub-components, and the fourth output control sub-component are of the same type (N-type transistors or P-type transistors), a first voltage signal is input on the first gate lines per row, a second voltage signal is input on the second gate line, and the first voltage signal is input on the third gate line and the fourth gate line concurrently, in the fingerprint recognition stage; and the first voltage signal is input on the first gate lines, the first voltage signal is input on the second gate line and the third gate line concurrently, and the second voltage signal is input on the third gate line, in the touch detection stage.

It shall be noted that, the first voltage signal is a valid scan signal, and the second voltage signal is an invalid scan signal; and taking the first gate lines and the first transistors as an example, when the first transistors are N-type transistors, the first voltage signal is a high-level signal, and the second voltage signal is a low-level signal, and when the first transistors are P-type transistors, the first voltage signal is a low-level signal, and the second voltage is a high-level signal, where the low-level signal and the high-level signal are only defined with respect to their high and low levels instead of particular magnitudes of their voltage, and the particular magnitudes of their voltage will be selected as needed in reality instead of being in some embodiments defined here.

Further, how to drive the respective signal lines in the display panel in the fingerprint recognition stage and the touch detection stage has been described above in details in the embodiments of the display panel, so a repeated description thereof will be omitted here.

Figure 10:
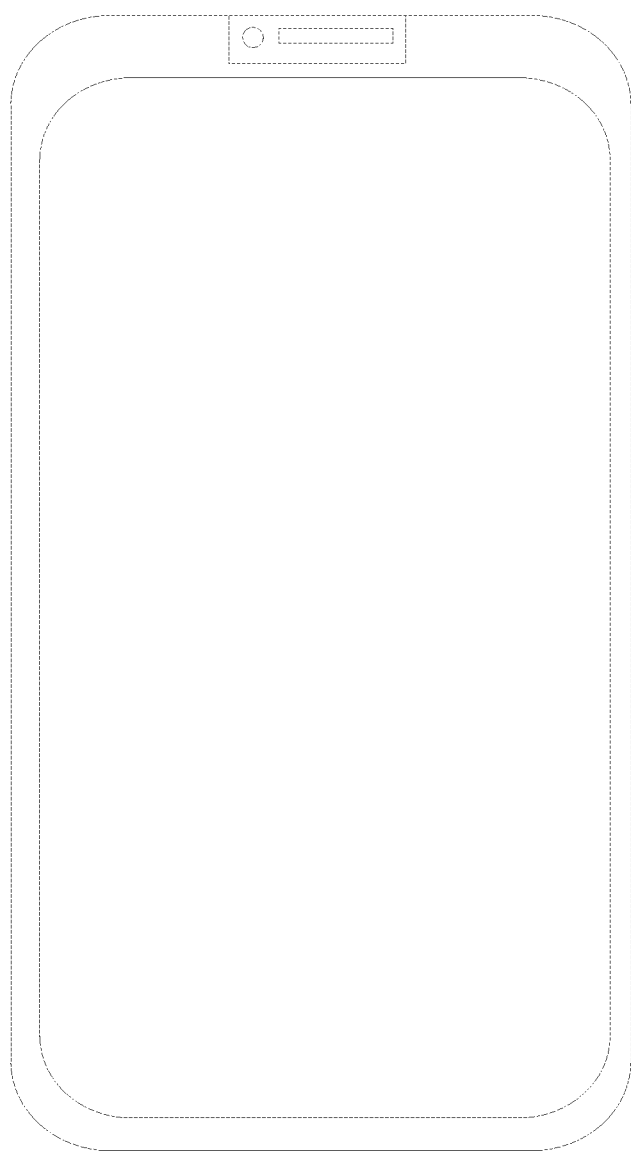
FIG. 10 is a schematic structural diagram of a display device according to the embodiments of the disclosure.

Based upon the same inventive concept, the embodiments of the disclosure further provide a display device as illustrated in FIG. 10, where the display device includes the display panel above according to the embodiments of the disclosure. The display device can be a mobile phone, a tablet computer, a TV set, a monitor, a notebook computer, a digital photo frame, a navigator, or any other product or component with a display function. All the other components indispensable to the display device shall readily occur to those ordinarily skilled in the art, so a repeated description thereof will be omitted here, and the embodiments of the disclosure will not be limited thereto. Reference can be made to the embodiments of the display panel above for an implementation of the display device, so a repeated description thereof will be omitted here.

In the display panel, the method for driving the same, and the display device above according to the embodiments of the disclosure, the display panel includes a plurality of detection circuits arranged in an array and configured to detect a touch and recognize a fingerprint, where each detection circuit includes a control component, and a plurality of photosensitive recognition components arranged in an array, where the plurality of photosensitive recognition components are configured to receive optical signals when a touch occurs or a fingerprint is to be recognized, to convert the optical signals into electric signals, and to provide the electric signals to the control component; and the control component is configured to obtain the electric signals provided by the plurality of photosensitive recognition components in the detection circuit, and in a process of recognizing a fingerprint, to process and then output the electric signals provided by the plurality of photosensitive recognition component separately, and in a process of detecting a touch, to superimpose the electric signals provided by the plurality of photosensitive recognition components in the detection circuit, and to process and output an electric signal resulting from the superimposition. The photosensitive recognition components and the control component cooperate with each other so that a touch position can be detected and a fingerprint can be recognized using the same detection circuit to thereby simplify a structure for detecting a touch position and recognizing a fingerprint in the display panel; and a touch position can be detected and a fingerprint can be recognized optically to thereby improve the precision of detecting a touch and recognizing a fingerprint.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A method for driving a display panel, the display panel comprises a plurality of detection circuits arranged in an array and configured to detect a touch and recognize a fingerprint;

wherein each of the plurality of detection circuits comprises a control component, and a plurality of photosensitive recognition components arranged in an array;

wherein the control component comprises: a plurality of first output control sub-components arranged in an array, a plurality of second output control sub-components, a plurality of third output control sub-components, a fourth output control sub-component, and a processing sub-component, wherein:

each of the plurality of first output control sub-components comprises a first transistor; wherein a gate of the first transistor is connected with a corresponding first gate line, a first electrode of the first transistor is connected with the corresponding photosensitive recognition component, and a second electrode of the first transistor is connected with the corresponding first node or a second node;

each of the plurality of second output control sub-components comprises a second transistor; wherein a gate of the second transistor is connected with a second gate line, a first electrode of the second transistor is connected with one corresponding first node, and a second electrode of the second transistor is connected with another corresponding first node or the second node;

each of the plurality of third output control sub-components comprises a third transistor; wherein a gate of the third transistor is connected with a third gate line, a first electrode of the third transistor is connected with a corresponding first node, and a second electrode of the third transistor is connected with the processing sub-component;

the fourth output control sub-component comprises a fourth transistor; wherein a gate of the fourth transistor is connected with a fourth gate line, a first electrode of the fourth transistor is connected with the second node, and a second electrode of the fourth transistor is connected with the processing sub-component;

each of the plurality of photosensitive recognition components comprises a photosensitive diode; the processing sub-component comprises a plurality of integrating amplifiers, a number of which is same as a total number of the plurality of third output control sub-components and the fourth output control sub-component; wherein each of the plurality of integrating amplifiers has an input terminal connected with a corresponding third output control sub-component or the fourth output control sub-component, and is configured to process and output an electric signal provided by the corresponding third output control sub-component or the fourth output control sub-component;

the method comprising:

receiving, by the plurality of photosensitive recognition components, the optical signals when a touch occurs or a fingerprint is to be recognized, converting the optical signals into the electric signals, and providing the electric signals to the control component; and in a fingerprint recognition stage, controlling, by first gate lines, first output control sub-components to be turned on to provide the electric signals provided by the plurality of photosensitive recognition components to first nodes or a second node; controlling, by a second gate line, second output control sub-components to be turned off; controlling, by a third gate line, third output control sub-components to be turned on to provide electric signals at the first nodes to a processing sub-component; and controlling, by a fourth gate line, a fourth output control sub-component to be turned on to provide a level of the second node to the processing sub-component; and in a touch detection stage, controlling, by the first gate lines, the first output control sub-components to be turned on to provide the electric signals provided by the plurality of photosensitive recognition components to the corresponding first nodes or the second node; controlling, by the second gate line, the second output control sub-components to be turned on to provide the electric signals at the first nodes to the second node; controlling, by the third gate line, the third output control sub-components to be turned off, and controlling, by the fourth gate line, the fourth output control sub-component to be turned on to provide the level of the second node to the processing sub-component.

2. The method for driving the display panel according to claim 1, wherein when transistors in the first output control sub-components, the second output control sub-components, the third output control sub-components, and the fourth output control sub-component are of a same type, a first voltage signal is input on the first gate lines per row, a second voltage signal is input on the second gate line, and the first voltage signal is input on the third gate line and the fourth gate line concurrently, in the fingerprint recognition stage; and the first voltage signal is input on the first gate lines, the first voltage signal is input on the second gate line and the third gate line concurrently, and the second voltage signal is input on the third gate line, in the touch detection stage.

3. The method for driving the display panel according to claim 1, wherein the first transistor, the second transistor, the third transistor and the fourth transistor are of a same type.

4. The method for driving the display panel according to claim 1, wherein respective first output control sub-components in a same column are connected with one same first node or the second node.

5. The method for driving the display panel according to claim 1, wherein the display panel further comprises a display circuit comprising a plurality of light-emitting components arranged in an array;

wherein an image is displayed using light emitted by the plurality of light-emitting components in a display stage; and a touch is detected, or a fingerprint is recognized, using the light emitted by the plurality of light-emitting components in a non-display stage;

each of the plurality of light-emitting components comprises: a drive control sub-component, a light-emitting control sub-component, an anode level control sub-component, and a light-emitting device, wherein:

the drive control sub-component comprises a drive transistor; wherein a gate of the drive transistor is connected with the data signal terminal, a first electrode of the drive transistor is connected with a drive signal terminal, and a second electrode of the drive transistor is connected with the light-emitting control sub-component;

the light-emitting control sub-component comprises a fifth transistor; wherein a gate of the fifth transistor is connected with the first control terminal, a first electrode of the fifth transistor is connected with the drive control sub-component, and a second electrode of the fifth transistor is connected with the anode of the light-emitting device;

the anode level control sub-component comprises a sixth transistor; wherein a gate of the sixth transistor is connected with the second control terminal, a first electrode of the sixth transistor is connected with the first signal terminal, and a second electrode of the sixth transistor is connected with the anode of the light-emitting device.

6. The method for driving the display panel according to claim 1, wherein in a period of time of one frame, light emitted from light-emitting components in a first area is used for recognizing a fingerprint, and light emitted from light-emitting components in another area than the first area is used for displaying an image and detecting a touch; wherein the first area is an area predetermined according to an area in which a touch occurred in a previous frame.

* * * * *